(12) United States Patent
Cheng et al.

(10) Patent No.: US 12,470,210 B2
(45) Date of Patent: Nov. 11, 2025

(54) DUTY CYCLE CORRECTION METHOD AND DUTY CYCLE CORRECTION APPARATUS

(71) Applicant: MACRONIX International Co., Ltd., Hsinchu (TW)

(72) Inventors: Wei-Yi Cheng, Tainan (TW); Su-Chueh Lo, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 134 days.

(21) Appl. No.: 18/475,239

(22) Filed: Sep. 27, 2023

(65) Prior Publication Data

US 2025/0105833 A1 Mar. 27, 2025

(51) Int. Cl.
*H03K 7/08* (2006.01)
*H03K 5/02* (2006.01)
*H03K 5/24* (2006.01)

(52) U.S. Cl.
CPC ............... *H03K 7/08* (2013.01); *H03K 5/023* (2013.01); *H03K 5/249* (2013.01)

(58) Field of Classification Search
CPC ....... H03K 2005/00065; H03K 5/1565; H03K 3/017; H03L 7/0998; H03L 7/0818; H03L 7/0814
USPC ................................................. 375/238, 376
See application file for complete search history.

(56) References Cited

U.S. PATENT DOCUMENTS

| | | | | |
|---|---|---|---|---|
| 5,757,218 | A * | 5/1998 | Blum | H03K 5/05 327/175 |
| 6,583,657 | B1 * | 6/2003 | Eckhardt | H03K 5/1565 327/175 |
| 2020/0365199 | A1 * | 11/2020 | Seong | H04L 7/0337 |
| 2022/0368332 | A1 * | 11/2022 | Lin | H03K 5/1565 |
| 2024/0162921 | A1 * | 5/2024 | Chakraborty | H04B 1/0028 |
| 2024/0219953 | A1 * | 7/2024 | Choi | G06F 1/08 |

FOREIGN PATENT DOCUMENTS

TW 202245408 11/2022

OTHER PUBLICATIONS

"Office Action of Taiwan Counterpart Application", issued on Jun. 14, 2024, pp. 1-6.

* cited by examiner

*Primary Examiner* — Khai Tran
(74) *Attorney, Agent, or Firm* — PATENTS (57) ABSTRACT

A duty cycle correction method and a duty cycle correction apparatus, adapted for correcting a duty cycle of a clock signal by using a duty cycle adjuster in a high-capacity and high-performance semiconductor product such as a 3D NAND flash, are provided. In the method, the duty cycle is adjusted and input to data pads to generate data signals, wherein the data pads are divided into at least two groups and defined by data patterns that are inverse to each other; DC voltages of the data signals of a first group of data pads are detected to generate a first average DC voltage, and DC voltages of the data signals of a second group of data pads are detected to generate a second average DC voltage, the aforementioned average DC voltages are compared, and the duty cycle adjuster is controlled to adjust the duty cycle of the clock signal.

20 Claims, 5 Drawing Sheets

DUTY CYCLE CORRECTION METHOD AND DUTY CYCLE CORRECTION APPARATUS

BACKGROUND

Technical Field

The disclosure relates to a correction method and an apparatus, and in particular relates to a duty cycle correction method and a duty cycle correction apparatus.

Description of Related Art

The distortion of the duty cycle due to the influence of the path affects the size of the effective window of the output data. In high-speed applications, it is necessary to minimize duty cycle distortion to avoid poor readout efficiency.

Figure 1:
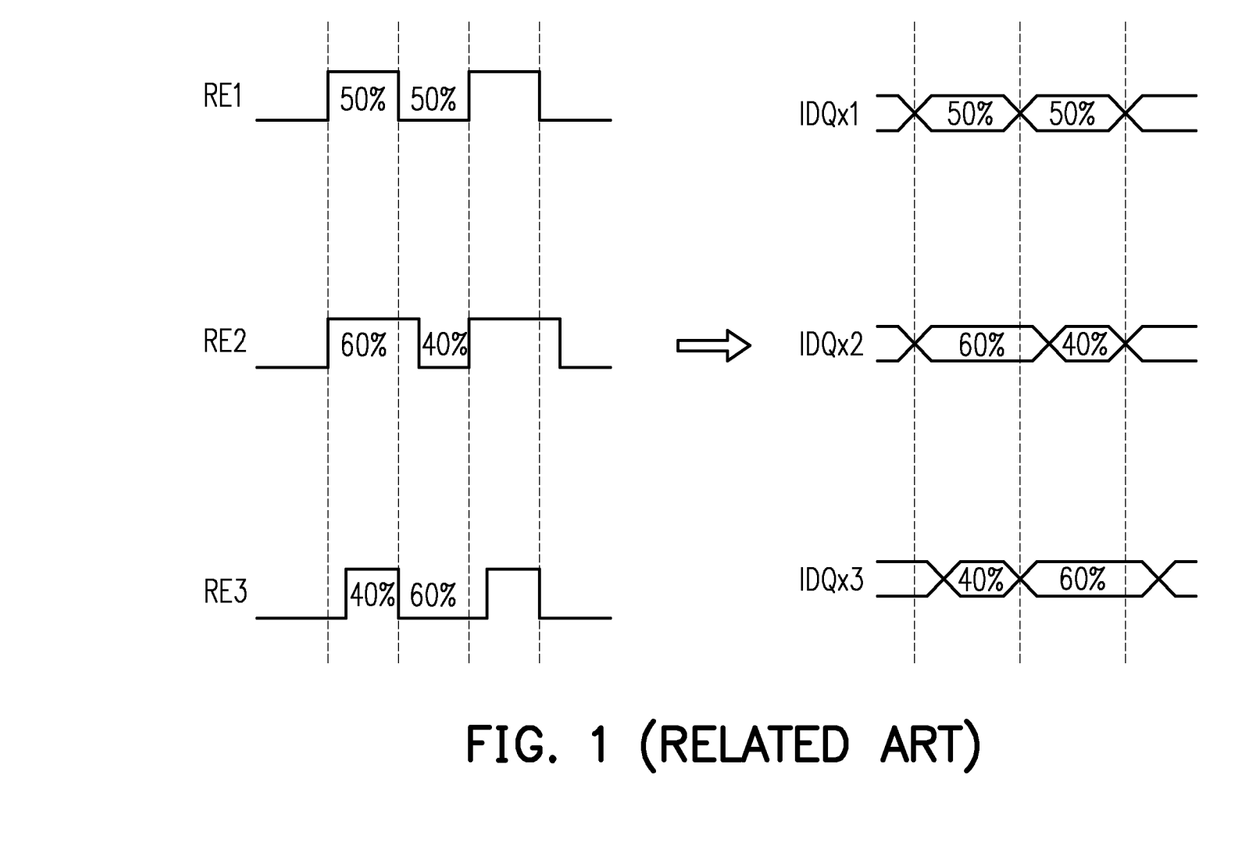
FIG. 1 is a schematic diagram of the relationship between the read enable (RE) clock signal and the data signal during traditional data reading.

FIG. 1 is a schematic diagram of the relationship between the read enable (RE) clock signal and the data signal during traditional data reading. Referring to FIG. 1, the duty cycle of the read enable signal RE1 is at the ideal 50%, that is, the lengths of logic high and logic low are the same. Therefore, the effective window of the data signal IDQ×1 read out by the read enable signal RE1 is 50%. The duty cycle of the read enable signal RE2 becomes 60% to 40%, that is, the length of the logic high is greater than the length of the logic low. Therefore, the effective window of the data signal IDQ×2 read out by the read enable signal RE2 is only 40%, which worsens the data reading efficiency. Similarly, the duty cycle of the read enable signal RE3 becomes 40% to 60%, that is, the length of the logic high is less than the length of the logic low. Therefore, the effective window of the data signal IDQ×3 read out by the read enable signal RE3 is also only 40%, which also worsens the data reading efficiency.

SUMMARY

In view of the above, a duty cycle correction method and a duty cycle correction apparatus, which may correct the skew of the clock signal and improve the data reading efficiency, are provided in the disclosure.

A duty cycle correction apparatus, which includes a duty cycle adjuster, a detection circuit, a comparator, and a control logic, is provided in the disclosure. The duty cycle adjuster is configured to adjust a duty cycle of a clock signal generated by a clock signal generator, and input the adjusted clock signal to multiple data pads of a storage device to generate multiple data signals. The data pads are divided into at least two groups, and defined by data patterns that are inverse to each other. The detection circuit includes multiple detectors respectively coupled to the data pads, configured to detect direct current (DC) voltages of the data signals generated by a first group of data pads to generate a first average DC voltage, and configured to detect DC voltages of the data signals generated by a second group of data pads to generate a second average DC voltage. The comparator is coupled to the detection circuit, configured to compare the first average DC voltage and the second average DC voltage and output a comparison result. The control logic is coupled to the comparator and configured to control the duty cycle adjuster to adjust the duty cycle of the clock signal according to the comparison result.

In an embodiment of the disclosure, the duty cycle correction apparatus further includes a switching circuit. The switching circuit includes multiple switches respectively coupled to multiple detectors and is configured to switch the switches to connect output terminals of the detectors coupled to the first group of data pads to a first terminal of the comparator, and connect output terminals of the detectors coupled to the second group of data pads to a second terminal of the comparator.

In an embodiment of the disclosure, the comparator includes outputting the comparison result that is logic low when determining that the first average DC voltage is greater than the second average DC voltage, and outputting the comparison result that is logic high when determining that the first average DC voltage is less than the second average DC voltage.

In an embodiment of the disclosure, the control logic includes determining whether the comparison result is logic low. If the comparison result is logic low, the duty cycle adjuster is controlled to reduce the duty cycle of the clock signal, and whether the comparison result changes to logic high is determined. When it is determined that the comparison result does not change to the logic high, the duty cycle adjuster is repeatedly controlled to reduce the duty cycle of the clock signal and the comparison is repeatedly performed until the comparison result changes to the logic high. If the comparison result is the logic high, the duty cycle adjuster is controlled to extend the duty cycle of the clock signal, and whether the comparison result changes to the logic low is determined. When it is determined that the comparison result does not change to the logic low, the duty cycle adjuster is repeatedly controlled to extend the duty cycle of the clock signal and the comparison is repeatedly performed until the comparison result changes to the logic low.

A duty cycle correction method, adapted for controlling a duty cycle adjuster to correct a duty cycle of a clock signal, is provided in the disclosure. The method includes the following operation. A duty cycle of a clock signal generated by a clock signal generator is adjusted by using a duty cycle adjuster, and the adjusted clock signal is input to multiple data pads of a storage device to generate data signals, in which the data pads are divided into at least two groups and defined by data patterns that are inverse to each other. Direct current (DC) voltages of the data signals generated by a first group of data pads are detected to generate a first average DC voltage, and DC voltages of the data signals generated by a second group of data pads are detected to generate a second average DC voltage by using a detection circuit including multiple detectors respectively coupled to the data pads. The first average DC voltage and the second average DC voltage are compared, and a comparison result is output by using a comparator coupled to the detection circuit. The duty cycle adjuster is controlled to adjust the duty cycle of the clock signal according to the comparison result by using a control logic coupled to the comparator.

In an embodiment of the disclosure, the duty cycle correction method further includes switching multiple switches by using a switching circuit, which includes multiple switches respectively coupled to multiple detectors, to connect output terminals of the detectors coupled to the first group of data pads to a first terminal of the comparator, and connect output terminals of the detectors coupled to the second group of data pads to a second terminal of the comparator.

In an embodiment of the disclosure, the operation of comparing the first average DC voltage and the second average DC voltage, and outputting the comparison result by using a comparator coupled to the detection circuit includes outputting a comparison result that is logic low when determining that the first average DC voltage is greater than the second average DC voltage, and outputting a comparison result that is logic high when determining that the first average DC voltage is less than the second average DC voltage.

In an embodiment of the disclosure, the operation of controlling the duty cycle adjuster to adjust the duty cycle of the clock signal according to the comparison result by using a control logic coupled to the comparator includes determining whether the comparison result is logic low. If the comparison result is logic low, the duty cycle adjuster is controlled to reduce the duty cycle of the clock signal, and whether the comparison result changes to logic high is determined. When it is determined that the comparison result does not change to the logic high, the duty cycle adjuster is repeatedly controlled to reduce the duty cycle of the clock signal and the comparison is repeatedly performed until the comparison result changes to the logic high. If the comparison result is the logic high, the duty cycle adjuster is controlled to extend the duty cycle of the clock signal, and whether the comparison result changes to the logic low is determined. When it is determined that the comparison result does not change to the logic low, the duty cycle adjuster is repeatedly controlled to extend the duty cycle of the clock signal and the comparison is repeatedly performed until the comparison result changes to the logic low.

In an embodiment of the disclosure, the detector includes detecting a length of a high point and a low point of a waveform of the data signals to calculate the DC voltages.

In an embodiment of the disclosure, the detector includes a low-pass filter or a DC converter.

In an embodiment of the disclosure, the control logic includes a chip external controller or an internal circuit.

In an embodiment of the disclosure, the comparator includes an operational amplifier.

In an embodiment of the disclosure, a number of bits representing a value 0 in the data patterns is the same as a number of bits representing a value 1.

In an embodiment of the disclosure, a number of the first group of data pads is the same as a number of the second group of data pads.

In order for the aforementioned features and advantages of the disclosure to be more understandable, embodiments of the accompanying drawings are described in detail below.

DETAILED DESCRIPTION OF DISCLOSED EMBODIMENTS

The embodiment of the disclosure involves dividing two or an even number of data signals equally into two groups, and defining data patterns that are inversely related to each other. The average DC voltages of two groups of data signals are detected and compared by using detectors such as low-pass filters and DC converters, so that the duty cycle adjuster may be controlled to adjust the duty cycle of the clock signal according to the comparison result, thereby effectively correcting the skew of the clock signal.

Figure 2:
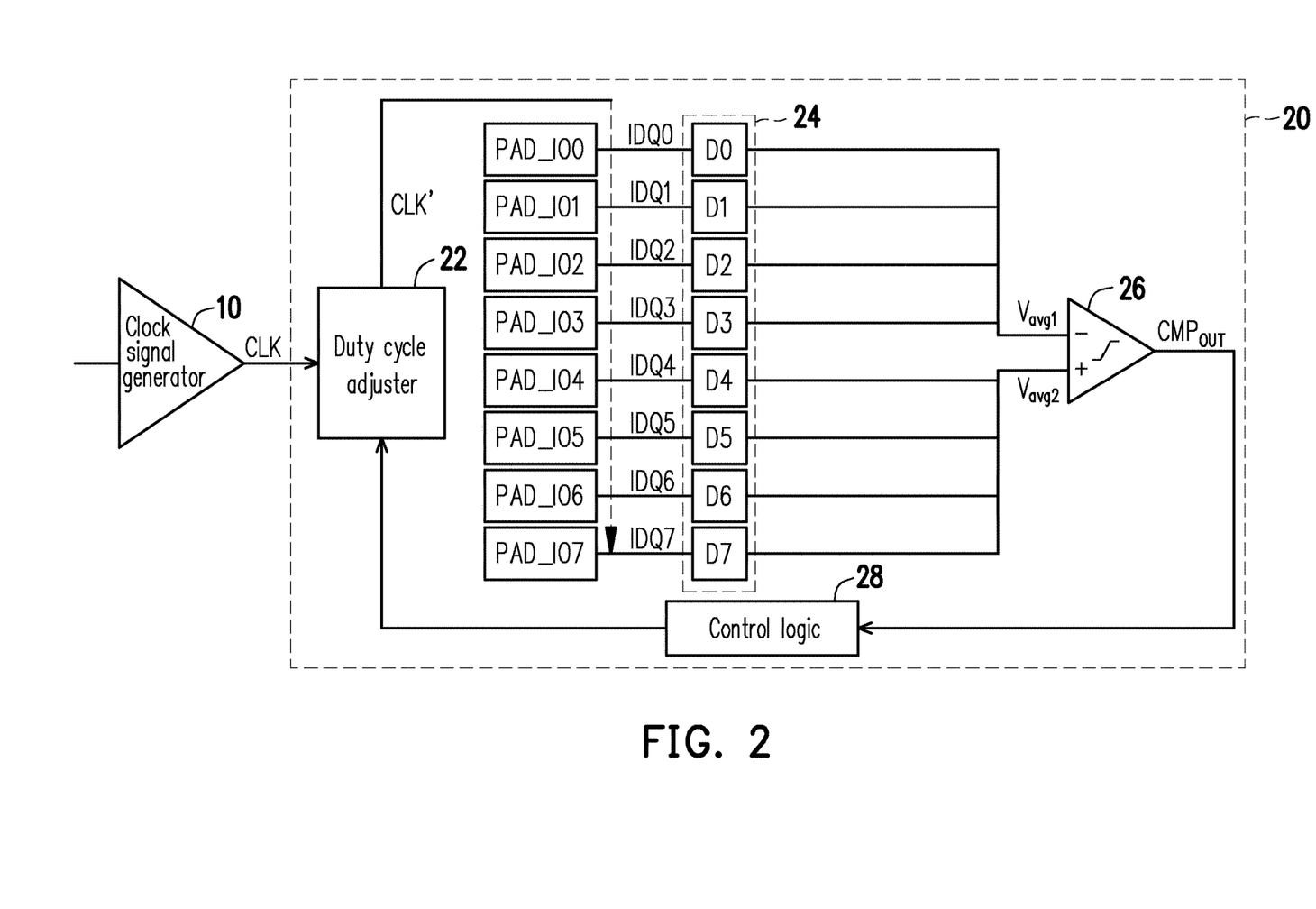
FIG. 2 is a schematic diagram of a duty cycle correction apparatus according to an embodiment of the disclosure.

FIG. 2 is a schematic diagram of a duty cycle correction apparatus according to an embodiment of the disclosure. Referring to FIG. 2, the duty cycle correction apparatus 20 of this embodiment is, for example, disposed in a semiconductor product and configured to correct the duty cycle of a clock signal provided to the semiconductor product. The semiconductor product is, for example, a non-volatile/volatile memory such as high-capacity and high-performance 3D NAND flash and dynamic random access memory (DRAM), or a logic device such as a microcontroller. The clock signal is, for example, a read enable (RE) signal configured to read memory data, which is not limited herein. The duty cycle correction apparatus 20 includes a duty cycle adjuster 22, a detection circuit 24, a comparator 26, and a control logic 28.

The duty cycle adjuster 22 is configured to adjust the duty cycle of the clock signal CLK generated by the clock signal generator 10, and input the adjusted clock signal CLK' to multiple data pads PAD_IO0 to PAD_IO7 of the storage device to generate multiple data signals IDQ0 to IDQ7. The storage device is, for example, a static random access memory (SRAM), a dynamic random access memory (DRAM), a NAND flash memory, a NOR flash memory, or a 2D or 3D structured resistive random access memory (ReRAM), which is not limited herein. In addition, the data pads PAD_IO0 to PAD_IO7 are divided into at least two groups, and are defined by data patterns that are inverse to each other.

In some embodiments, the data pads PAD_IO0 to PAD_IO7 may be divided into two groups. The number of data pads in the first group of data pads is the same as the number of data pads in the second group of data pads, and data patterns that are inverse to each other are defined. In the data patterns, the number of bits representing the value 0 is the same as the number of bits representing the value 1. For example, when the data pattern of the first group of data pads is 101010, the data pattern of the second group of data pads is 010101, which is the inverse of 101010. The number of 0s and 1s in both data patterns is 3.

The detection circuit 24 includes multiple detectors D0 to D7, which are respectively coupled to the data pads PAD_IO0 to PAD_IO7 and are configured to detect the length of the high point and the low point of the waveform of the data signals IDQ0 to IDQ7 to calculate the DC voltage. The detectors D0 to D7 are, for example, low-pass filters or DC converters, which are not limited herein.

In this embodiment, the output terminals of the detectors D0 to D3 are connected to the negative input terminal of the comparator 26, and the output terminals of the detectors D4 to D7 are connected to the positive input terminal of the comparator 26. The DC voltage obtained by respectively detecting the data signals IDQ0 to IDQ3 by the detectors D0 to D3 becomes the first average DC voltage $V_{avg1}$ and is input to the negative input terminal of the comparator 26. The DC voltage obtained by respectively detecting the data signals IDQ4 to IDQ7 by the detectors D4 to D7 becomes the second average DC voltage $V_{avg2}$ and is input to the positive input terminal of the comparator 26. In other embodiments, the detectors D0 to D7 in the detection circuit 24 may be divided into two groups or an even number of groups by adapting other methods, which is not limited herein.

The comparator 26 is, for example, an operational amplifier, and is configured to compare the first average DC voltage $V_{avg1}$ and the second average DC voltage $V_{avg2}$ to generate a comparison result $CMP_{OUT}$, and output the comparison result $CMP_{OUT}$ to the control logic 28.

The control logic 28 is configured to control the duty cycle adjuster 22 to adjust the duty cycle of the clock signal CLK according to the comparison result $CMP_{OUT}$ output by the comparator 26 to correct the skew of the clock signal CLK. In this embodiment, the control logic 28 is an internal circuit of the semiconductor product, but in other embodiments, the control logic 28 may also be a chip external controller located outside the semiconductor device, which is not limited herein.

Figure 3:
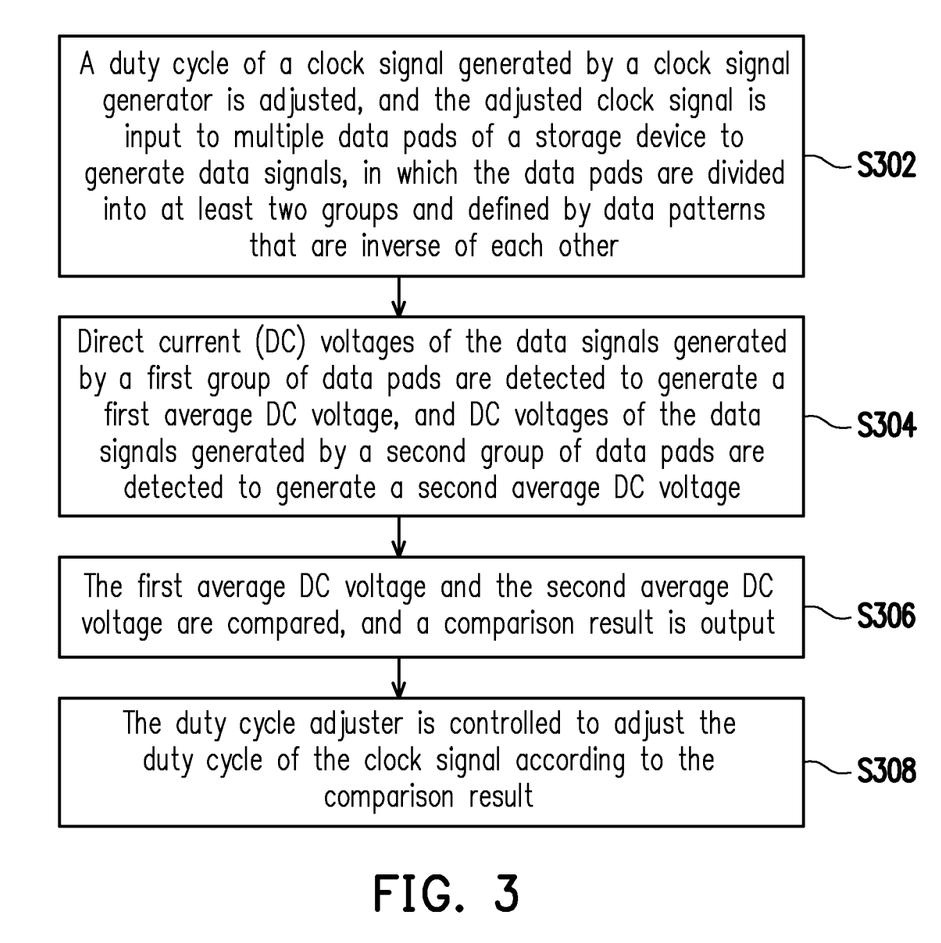
FIG. 3 is a flowchart of a duty cycle correction method according to an embodiment of the disclosure.

In detail, FIG. 3 is a flowchart of a duty cycle correction method according to an embodiment of the disclosure. Referring to FIG. 2 and FIG. 3 at the same time, the detailed steps of the duty cycle correction method of this embodiment are described below with reference to various circuits and components of the duty cycle correction apparatus 20.

In step S302, the duty cycle of the clock signal CLK generated by the clock signal generator 10 is adjusted by using the duty cycle adjuster 22, and the adjusted clock signal CLK' is input to multiple data pads PAD_IO0 to PAD_IO7 of the storage device to generate multiple data signals IDQ0 to IDQ7. The data pads PAD_IO0 to PAD_IO7 are divided into at least two groups, and are defined by data patterns that are inverse to each other.

In step S304, direct current (DC) voltages of the data signals generated by a first group of data pads is detected to generate a first average DC voltage $V_{avg1}$, and DC voltages of the data signals generated by a second group of data pads are detected to generate a second average DC voltage $V_{avg2}$ by using the detection circuit 24.

In step S306, the first average DC voltage $V_{avg1}$ and the second average DC voltage $V_{avg2}$ are compared, and a comparison result $CMP_{OUT}$ is output by the comparator 26. If the first average DC voltage $V_{avg1}$ is greater than the second average DC voltage $V_{avg2}$, the comparator 26 outputs a comparison result $CMP_{OUT}$ that is logic low. On the contrary, if the first average DC voltage $V_{avg1}$ is less than the second average DC voltage $V_{avg2}$, the comparator 26 outputs a comparison result $CMP_{OUT}$ that is logic high.

In step S308, the duty cycle adjuster 22 is controlled to adjust the duty cycle of the clock signal CLK according to the comparison result $CMP_{OUT}$ by using the control logic 28.

The control logic 28 continues to control the duty cycle adjuster 22 to adjust the duty cycle of the clock signal CLK until the comparison result $CMP_{OUT}$ of the comparator 26 changes from logic low to logic high, or from logic high to logic low.

Figure 4:
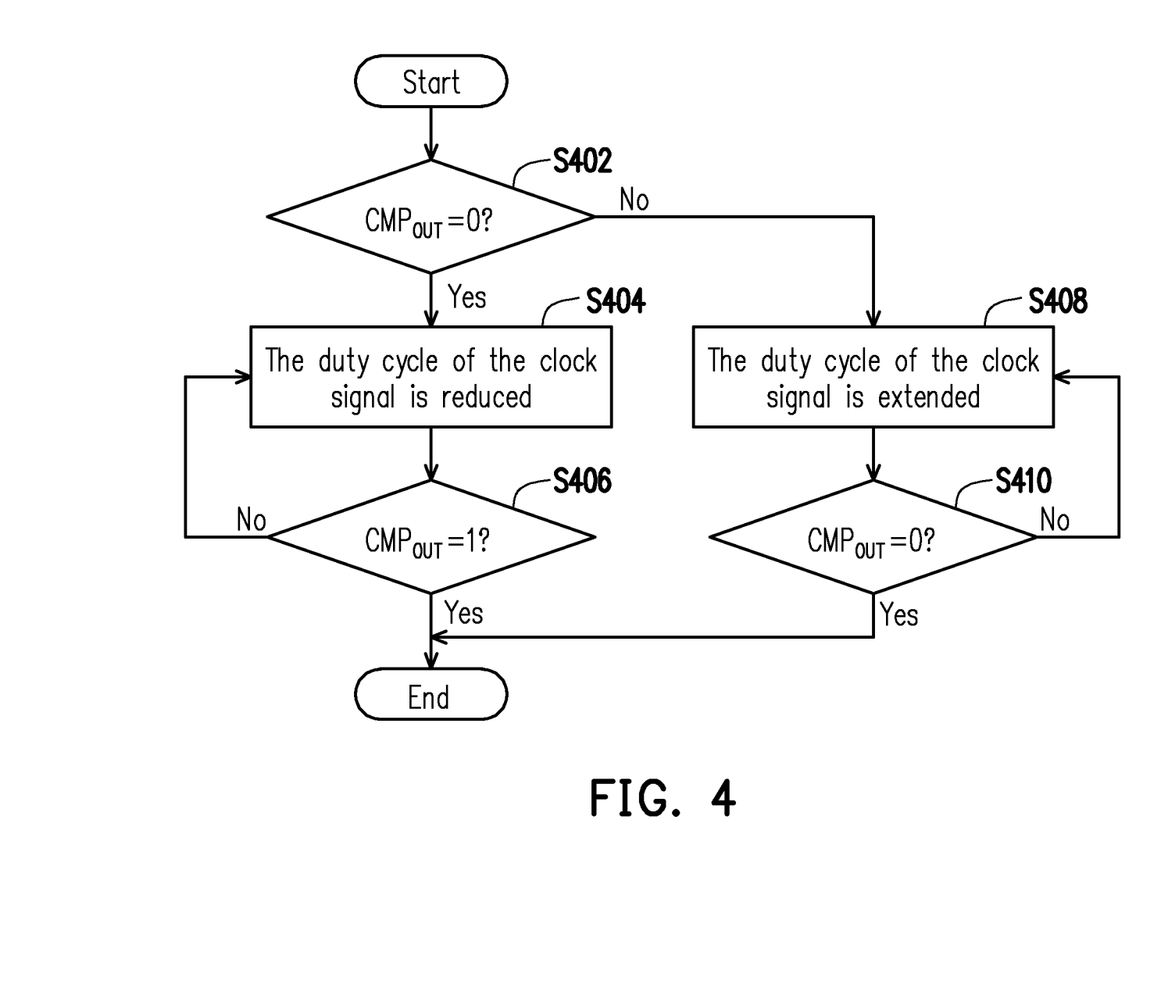
FIG. 4 is a control flow diagram of the control logic according to an embodiment of the disclosure.

In detail, FIG. 4 is a control flow diagram of the control logic according to an embodiment of the disclosure. Referring to FIG. 2 and FIG. 4 at the same time, the control process of this embodiment are described below with reference to various circuits and components of the duty cycle correction apparatus 20.

In step S402, the control logic 28 determines whether the comparison result $CMP_{OUT}$ of the comparator 26 is 0 (logic low).

If so (yes), in step S404, the control logic 28 controls the duty cycle adjuster 22 to reduce the duty cycle of the clock signal CLK, and in step S406, it is determined whether the comparison result $CMP_{OUT}$ of the comparator 26 changes to 1 (logic high).

If it does not change to 1, then return to step S404, and the control logic 28 controls the duty cycle adjuster 22 to reduce the duty cycle of the clock signal CLK again. Steps S404 and S406 are repeated until the comparison result $CMP_{OUT}$ changes to 1, ending the adjustment of the duty cycle of the clock signal CLK.

In step S402, if the control logic 28 determines that the comparison result $CMP_{OUT}$ of the comparator 26 is not 0 (logic high), then in step S408, the control logic 28 controls the duty cycle adjuster 22 to extend the duty cycle of the clock signal CLK, and in step S410, it is determined whether the comparison result $CMP_{OUT}$ of the comparator 26 changes to 0 (logic low).

If it does not change to 0, then return to step S408, and the control logic 28 controls the duty cycle adjuster 22 to extend the duty cycle of the clock signal CLK again. Steps S408 and S410 are repeated until the comparison result $CMP_{OUT}$ changes to 0, ending the adjustment of the duty cycle of the clock signal CLK.

Through the above method, the duty cycle of the clock signal CLK may be gradually adjusted back to 50%, thereby improving the data reading efficiency.

Figure 5:
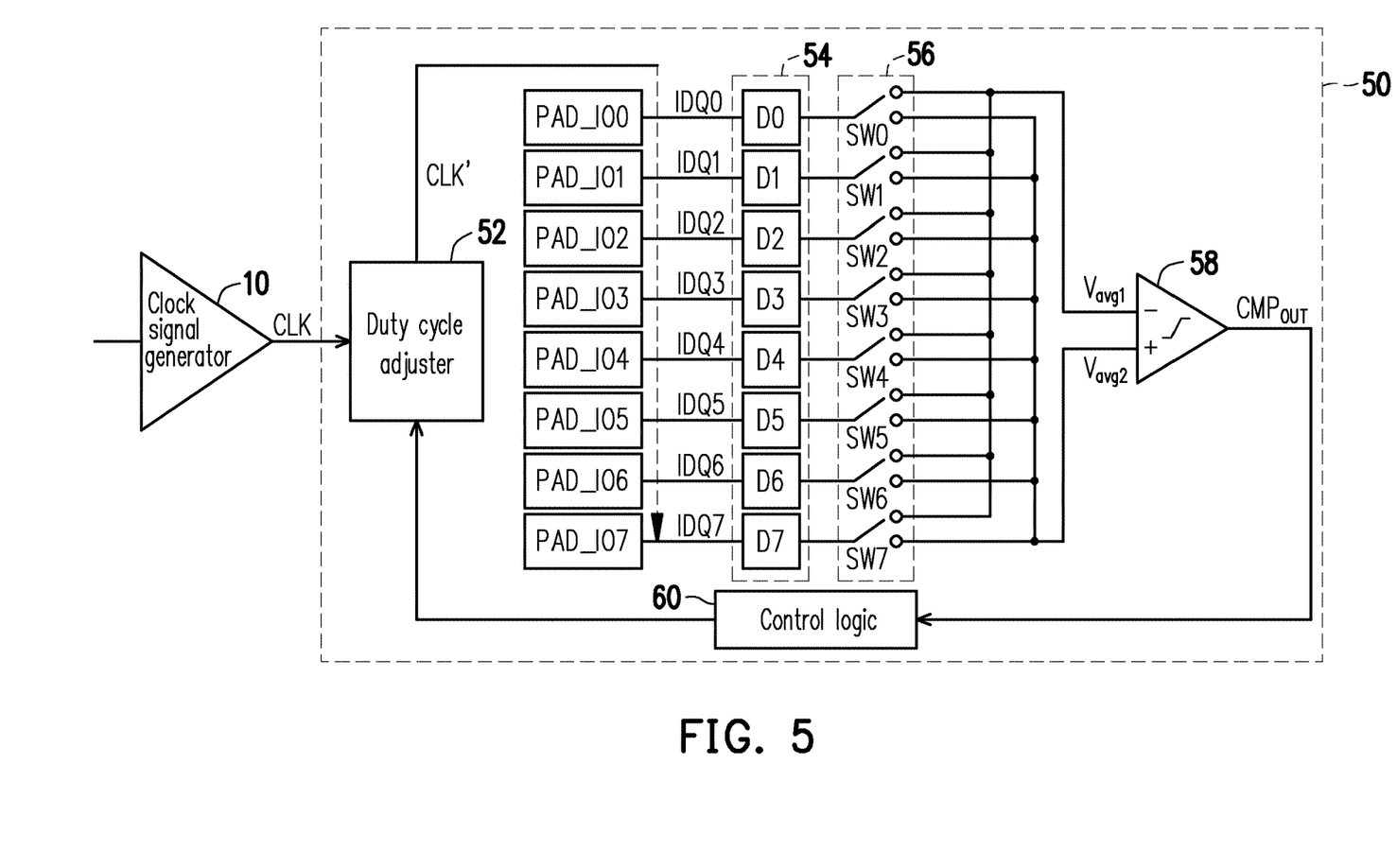
FIG. 5 is a schematic diagram of a duty cycle correction apparatus according to an embodiment of the disclosure.

FIG. 5 is a schematic diagram of a duty cycle correction apparatus according to an embodiment of the disclosure. Referring to FIG. 5, the duty cycle correction apparatus 50 of this embodiment is, for example, disposed in a semiconductor product and configured to correct the duty cycle of a clock signal provided to the semiconductor product. The semiconductor product is, for example, a non-volatile/volatile memory such as high-capacity and high-performance 3D NAND flash and dynamic random access memory (DRAM), or a logic device such as a microcontroller. The clock signal is, for example, a read enable (RE) signal configured to read memory data, which is not limited herein.

The duty cycle correction apparatus 50 includes a duty cycle adjuster 52, a detection circuit 54, a switching circuit 56, a comparator 58, and a control logic 60. The duty cycle adjuster 52, the detection circuit 54, the comparator 58, and the control logic 60 are the same or similar to the duty cycle adjuster 22, the detection circuit 24, the comparator 26, and the control logic 28 of the previous embodiment, so their detailed functions are not described herein.

Different from the previous embodiment, in this embodiment, the duty cycle correction apparatus 50 additionally includes a switching circuit 56. The switching circuit 56 includes multiple switches SW0 to SW7 respectively coupled to the detectors D0 to D7. The switching circuit 56 connects the output terminals of the detectors coupled to the first group of data pads to the first terminal of comparator 58, and connects the output terminals of the detectors coupled to the second group of data pads to the second terminal of comparator 58 by switching the switches SW0 to SW7.

In some embodiments, the switching circuit 56 may connect the output terminals of the detectors D0 to D3 to the negative input terminal of the comparator 58 and connect the output terminals of the detectors D4 to D7 to the positive input terminal of the comparator 58 by switching the switches SW0 to SW7. The DC voltage obtained by respectively detecting the data signals IDQ0 to IDQ3 by the detectors D0 to D3 becomes the first average DC voltage $V_{avg1}$ and is input to the negative input terminal of the comparator 58 through the connection of the switches SW0 to SW3. The DC voltage obtained by respectively detecting the data signals IDQ4 to IDQ7 by the detectors D4 to D7 becomes the second average DC voltage $V_{avg2}$ and is input to the positive input terminal of the comparator 58 through the connection of the switches SW4 to SW7.

The comparator 58 compares the first average DC voltage $V_{avg1}$ and the second average DC voltage $V_{avg2}$ to generate a comparison result $CMP_{OUT}$, and outputs the comparison result $CMP_{OUT}$ to the control logic 60. The control logic 60 controls the duty cycle adjuster 52 to adjust the duty cycle of the clock signal CLK according to the comparison result $CMP_{OUT}$ output by the comparator 58 to correct the skew of the clock signal CLK.

To sum up, according to the embodiments of the disclosure, a duty cycle correction method and a duty cycle correction apparatus are provided, in which the data path (DQ path) is divided into two groups and data patterns that are inverse to each other are defined, so that the skew of the clock signal may be detected by comparing the average DC voltage of the two groups of data signals. In addition, by feeding back the comparison result to the control logic, the control logic controls the duty cycle adjuster accordingly, so the duty cycle of the clock signal may be properly adjusted, thereby improving the data reading efficiency.

Although the disclosure has been disclosed through the above embodiments, the embodiments are not intended to limit the disclosure. It will be obvious to those of ordinary knowledge in the art that various modifications and changes may be made in the structure of the disclosure without departing from the scope or spirit of the disclosure. Therefore, the protection scope of the disclosure falls within the scope of the appended patent claims.

What is claimed is:

1. A duty cycle correction apparatus, comprising:
   a duty cycle adjuster, adjusting a duty cycle of a clock signal generated by a clock signal generator, and inputting the adjusted clock signal to a plurality of data pads of a storage device to generate a plurality of data signals, wherein the data pads are divided into at least two groups, and defined by data patterns that are inverse to each other;
   a detection circuit, comprising a plurality of detectors respectively coupled to the data pads, detecting direct current voltages of the data signals generated by a first group of the data pads to generate a first average direct current voltage, and detecting direct current voltages of the data signals generated by a second group of the data pads to generate a second average direct current voltage;
   a comparator, coupled to the detection circuit, comparing the first average direct current voltage and the second average direct current voltage and outputting a comparison result; and
   a control logic, coupled to the comparator and controlling the duty cycle adjuster to adjust the duty cycle of the clock signal according to the comparison result.

2. The duty cycle correction apparatus according to claim 1, further comprising:
   a switching circuit, comprising a plurality of switches respectively coupled to the detectors, switching the switches to connect output terminals of the detectors coupled to the first group of the data pads to a first terminal of the comparator, and to connect output terminals of the detectors coupled to the second group of the data pads to a second terminal of the comparator.

3. The duty cycle correction apparatus according to claim 1, wherein the comparator comprises:
   outputting the comparison result that is logic low when determining that the first average direct current voltage is greater than the second average direct current voltage; and
   outputting the comparison result that is logic high when determining that the first average direct current voltage is less than the second average direct current voltage.

4. The duty cycle correction apparatus according to claim 3, wherein the control logic comprises:
   determining whether the comparison result is the logic low;
   controlling the duty cycle adjuster to reduce the duty cycle of the clock signal if the comparison result is the logic low, determining whether the comparison result changes to the logic high, and repeatedly controlling the duty cycle adjuster to reduce the duty cycle of the clock signal and performing the comparison when determining that the comparison result does not change to the logic high, until the comparison result changes to the logic high; and
   controlling the duty cycle adjuster to extend the duty cycle of the clock signal if the comparison result is the logic high, determining whether the comparison result changes to the logic low, and repeatedly controlling the duty cycle adjuster to extend the duty cycle of the clock signal and performing the comparison when determining that the comparison result does not change to the logic low, until the comparison result changes to the logic low.

5. The duty cycle correction apparatus according to claim 1, wherein the detectors comprise detecting a length of a high point and a low point of a waveform of the data signals to calculate the direct current voltages.

6. The duty cycle correction apparatus according to claim 1, wherein the detectors comprise a low-pass filter or a direct current converter.

7. The duty cycle correction apparatus according to claim 1, wherein the comparator comprises an operational amplifier.

8. The duty cycle correction apparatus according to claim 1, wherein the control logic comprises a chip external controller or an internal circuit.

9. The duty cycle correction apparatus according to claim 1, wherein a number of bits representing a value 0 in the data patterns is the same as a number of bits representing a value 1.

10. The duty cycle correction apparatus according to claim 1, wherein a number of the first group of the data pads is the same as a number of the second group of the data pads.

11. A duty cycle correction method, adapted for controlling a duty cycle adjuster to correct a duty cycle of a clock signal, the method comprising:
    adjusting the duty cycle of the clock signal generated by a clock signal generator by using a duty cycle adjuster, and inputting the adjusted clock signal to a plurality of data pads of a storage device to generate a plurality of data signals, wherein the data pads are divided into at least two groups and defined by data patterns that are inverse to each other;
    detecting direct current voltages of the data signals generated by a first group of the data pads to generate a first average direct current voltage, and detecting direct current voltages of the data signals generated by a second group of the data pads are detected to generate a second average direct current voltage by using a detection circuit comprising a plurality of detectors respectively coupled to the data pads;
    comparing the first average direct current voltage and the second average direct current voltage, and outputting a comparison result by using a comparator coupled to the detection circuit; and
    controlling the duty cycle adjuster to adjust the duty cycle of the clock signal according to the comparison result by using a control logic coupled to the comparator.

12. The duty cycle correction method according to claim 11, further comprising:
   switching a plurality of switches by using a switching circuit comprising the switches respectively coupled to the detectors, to connect output terminals of the detectors coupled to the first group of the data pads to a first terminal of the comparator, and to connect output terminals of the detectors coupled to the second group of the data pads to a second terminal of the comparator.

13. The duty cycle correction method according to claim 11, wherein comparing the first average direct current voltage and the second average direct current voltage, and outputting the comparison result by using the comparator coupled to the detection circuit comprises:
   outputting the comparison result that is logic low when determining that the first average direct current voltage is greater than the second average direct current voltage; and
   outputting the comparison result that is logic high when determining that the first average direct current voltage is less than the second average direct current voltage.

14. The duty cycle correction method according to claim 13, wherein controlling the duty cycle adjuster to adjust the duty cycle of the clock signal according to the comparison result by using the control logic coupled to the comparator comprises:
   determining whether the comparison result is the logic low;
   controlling the duty cycle adjuster to reduce the duty cycle of the clock signal if the comparison result is the logic low, determining whether the comparison result changes to the logic high, and repeatedly controlling the duty cycle adjuster to reduce the duty cycle of the clock signal and performing the comparison when determining that the comparison result does not change to the logic high, until the comparison result changes to the logic high; and
   controlling the duty cycle adjuster to extend the duty cycle of the clock signal if the comparison result is the logic high, determining whether the comparison result changes to the logic low, and repeatedly controlling the duty cycle adjuster to extend the duty cycle of the clock signal and performing the comparison when determining that the comparison result does not change to the logic low, until the comparison result changes to the logic low.

15. The duty cycle correction method according to claim 11, wherein the detectors comprise detecting a length of a high point and a low point of a waveform of the data signals to calculate the direct current voltage.

16. The duty cycle correction method according to claim 11, wherein the detectors comprise a low-pass filter or a direct current converter.

17. The duty cycle correction method according to claim 11, wherein the control logic comprises a chip external controller or an internal circuit.

18. The duty cycle correction method according to claim 11, wherein the comparator comprises an operational amplifier.

19. The duty cycle correction method according to claim 11, wherein a number of bits representing a value 0 in the data patterns is the same as a number of bits representing a value 1.

20. The duty cycle correction method according to claim 11, wherein a number of the first group of the data pads is the same as a number of the second group of the data pads.

* * * * *